United States Patent
Zhu et al.

(10) Patent No.: US 9,625,517 B2
(45) Date of Patent: Apr. 18, 2017

(54) LEAKAGE CURRENT DETECTION METHOD AND APPARATUS FOR DETECTING LEAKAGE OF CURRENT FROM A BOARD-MOUNTED COMPONENT

(71) Applicant: Huawei Technologies Co., Ltd., Shenzhen (CN)

(72) Inventors: Qingsong Zhu, Shenzhen (CN); Lujun Xie, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 204 days.

(21) Appl. No.: 14/497,660

(22) Filed: Sep. 26, 2014

(65) Prior Publication Data

US 2015/0042374 A1 Feb. 12, 2015

Related U.S. Application Data

(63) Continuation of application No. PCT/CN2014/071043, filed on Jan. 22, 2014.

(30) Foreign Application Priority Data

Aug. 9, 2013 (CN) .......................... 2013 1 0348175

(51) Int. Cl.
G01R 31/27 (2006.01)
G01R 31/02 (2006.01)
G01R 31/28 (2006.01)

(52) U.S. Cl.
CPC ........ G01R 31/2813 (2013.01); G01R 31/028 (2013.01)

(58) Field of Classification Search
CPC ........................... G01R 31/2813; G01R 31/028
(Continued)

(56) References Cited

U.S. PATENT DOCUMENTS 7,215,127 B1 * 5/2007 Lu ........................ G01R 31/025
324/548
2002/0153901 A1 10/2002 Davis et al.
2009/0243636 A1 10/2009 Johansen et al.

FOREIGN PATENT DOCUMENTS

CN 101839936 A 9/2010
CN 101944886 A 1/2011
(Continued)

OTHER PUBLICATIONS

Partial English Translation and Abstract of Japanese Patent Application No. JPH1172529A, Sep. 16, 2014, 8 pages.
(Continued)

*Primary Examiner* — Billy Lactaoen
(74) *Attorney, Agent, or Firm* — Conley Rose, P.C.

(57) ABSTRACT

A leakage current detection method and apparatus are provided. The method is applied to leakage current detection for a board-mounted component on a printed circuit board assembly (PCBA) board, and includes: providing a fixed voltage for a leakage current input end of a board-mounted component under detection, and connecting a leakage current output end to an inverting input end of an operational amplifier of a resistance testing module, where the resistance testing module includes the operational amplifier and a reference resistor that is connected between the inverting input end of the operational amplifier and the voltage output of the operational amplifier; detecting an output voltage of the resistance testing module; and calculating, based on Ohm's law and according to the output voltage and the reference resistor, a leakage current flowing through the board-mounted component under detection.

14 Claims, 4 Drawing Sheets

(58) Field of Classification Search
USPC ........................................ 324/762.03, 762.01
See application file for complete search history.

(56) References Cited

FOREIGN PATENT DOCUMENTS

| | | |
|---|---|---|
| CN | 101981459 A | 2/2011 |
| CN | 202075330 U | 12/2011 |
| JP | 58129266 A | 8/1983 |
| JP | 1172529 A | 3/1999 |
| WO | 2004086069 A1 | 10/2004 |

OTHER PUBLICATIONS

Foreign Communication From a Counterpart Application, PCT Application No. PCT/CN2014/071043, International Search Report dated May 26, 2014, 8 pages.
Foreign Communication From a Counterpart Application, PCT Application No. PCT/CN2014/071043, Written Opinion dated May 26, 2014, 5 pages.
Partial English Translation and Abstract of European Patent Application No. WO2004086069, Part 1, Jun. 16, 2016, 11 pages.
Partial English Translation and Abstract of European Patent Application No. WO2004086069, Part 2, Jun. 16, 2016, 4 pages.
Foreign Communication From a Counterpart Application, European Application No. 14834041.7, Extended European Search Report dated Jun. 8, 2016, 9 pages.

\* cited by examiner

LEAKAGE CURRENT DETECTION METHOD AND APPARATUS FOR DETECTING LEAKAGE OF CURRENT FROM A BOARD-MOUNTED COMPONENT

CROSS-REFERENCE TO RELATED APPLICATIONS

This application is a continuation of International Application No. PCT/CN2014/071043, filed on Jan. 22, 2014, which claims priority to Chinese Patent Application No. 201310348175.7, filed on Aug. 9, 2013, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of leakage current detection technologies, and in particular, to a leakage current detection method and apparatus.

BACKGROUND

Leakage current refers to a very small current flowing through a semiconductor component when a PN junction is in cut-off state or when charging of a capacitor is complete, and is also referred to as an Ir leakage current. The leakage current is an inherent feature and an important performance indicator of a semiconductor component, a filter, a power supply, and a capacitor. Due to surface damages of a component, wafer cracks, and the like caused by problems such as vendor process exceptions, raw material contamination, and internal management, a leakage current of the component often exceeds a limit.

When a component is just delivered from the factory, latent problems such as stress, cracks, and contamination may not be directly presented as an abnormal leakage current. In an initial stage of the leakage current, generally functions of a product are not affected directly. Therefore, a leakage current exceeding a limit belongs to a latent defect of the component. After the component experiences power-on, reflow soldering, and thermal shock, air inside the cracks of the component expands or contamination ions rapidly diffuse. Therefore, abnormality of the component occurs, resulting in a leakage current exceeding a limit. As time goes by, under an effect of an environmental factor such as humidity, temperature, and voltage, the leakage current becomes severe gradually, which shortens the service life of the product substantially.

In prior art 1, a test pen is operated manually to probe a component under detection to perform a leakage current test. This manual testing manner is inefficient and consumes a lot of manpower and material resources.

Figure 1:
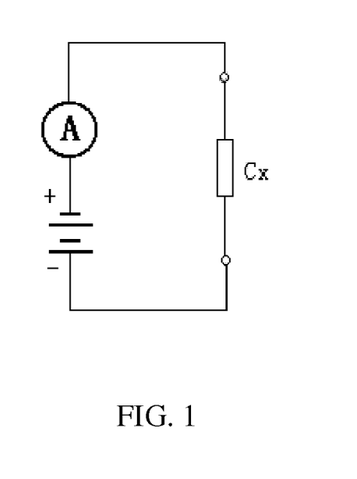
FIG. 1 shows a circuit diagram of leakage current detection in the prior art.

In prior art 2, a leakage current test is performed by using a commercial semiconductor tester (for example, Agilent® 4339B, or the like). As shown in FIG. 1, a nominal voltage is applied between two ends of a component under detection, and an ammeter is used to measure a small current flowing through the component under detection. The leakage current is generally at a 10*E to 9 A level. Therefore, in a common electrical qualification test for a board-mounted component, it is difficult to stably test a leakage current. In addition, this manner is mainly applied to sample inspection and delivery detection in incoming quality control (IQC), batch detection cannot be implemented, and a detection ratio is limited.

Moreover, the foregoing test manners are only intended for testing an isolated component. When the component is surface mounted to a board, leakage current detection may not be performed any longer. When leakage current detection is required, the component needs to be removed from the board before being detected. Consequently, a large number of components subject to a leakage current problem flow into markets, causing a board function failure.

SUMMARY

Technical Problem

In view of the above, a technical problem to be resolved by the present invention is to provide a leakage current detection method and apparatus, so as to implement that a leakage current test is performed on a board-mounted component without a need of removing the component under detection from a board, thereby improving test efficiency and accuracy, and increasing a detection ratio.

Solution

To resolve the foregoing technical problem, an embodiment of the present invention provides a leakage detection method, which is applied to leakage current detection for a board-mounted component on a Printed Circuit Board Assembly (PCBA) board. The method includes: providing a fixed voltage for a leakage current input end of a board-mounted component under detection, and connecting a leakage current output end to an inverting input end of an operational amplifier of a resistance testing module, where the resistance testing module includes the operational amplifier and a reference resistor that is connected between the inverting input end of the operational amplifier and the voltage output of the operational amplifier; detecting an output voltage of the resistance testing module; and calculating, based on Ohm's law and according to the output voltage and the reference resistor, a leakage current flowing through the board-mounted component under detection.

As regards the foregoing leakage current detection method, in a possible implementation manner, the board mounted component under detection is a semiconductor component, the leakage current input end is a source terminal of the semiconductor component in cut-off state, and the leakage current output end is a drain terminal of the semiconductor in cut-off state.

As regards the foregoing leakage current detection method, in a possible implementation manner, when the board-mounted component under detection is a capacitor having a positive pole and a negative pole, the leakage current input end is the positive pole of the capacitor, and the leakage current output end is the negative pole of the capacitor.

As regards the foregoing leakage current detection method, in a possible implementation manner, when the board-mounted component under detection is a capacitor without a positive pole or a negative pole, the leakage current input end is one end of the capacitor, and the leakage current output end is the other end of the capacitor.

As regards the foregoing leakage current detection method, in a possible implementation manner, with respect to a board-mounted component connected to one or more other components, before the detecting an output voltage of the resistance testing module, the method further includes: isolating the board-mounted component under detection from the one or more other components to which the board-mounted component under detection is connected, where an isolated end of the one or more other components is an isolation end.

As regards the foregoing leakage current detection method, in a possible implementation manner, the isolating the board-mounted component under detection from the one or more other components to which the board-mounted component under detection is connected specifically includes: making one or more other components that are connected to the leakage current input end of the board-mounted component under detection equivalent to a first resistor, making one or more other components that are connected to the leakage current output end of the board-mounted component under detection equivalent to a second resistor, and configuring an isolation end between the first resistor and the second resistor to have a same potential as the leakage current output end of the board-mounted component under detection.

As regards the foregoing leakage current detection method, in a possible implementation manner, the isolating the board-mounted component under detection from the one or more other components to which the board-mounted component under detection is connected further includes, when the board-mounted component under detection is a board-mounted semiconductor component, configuring the board-mounted semiconductor component to be in cut-off state.

As regards the foregoing leakage current detection method, in a possible implementation manner, the calculating, based on Ohm's law and according to the output voltage and the reference resistor, a leakage current flowing through the board-mounted component under detection includes calculating the leakage current flowing through the board-mounted component under detection according to Formula 7:

$$I_X = \frac{V_i}{R_X} = \frac{V_O}{R_{ref}} = I_{ref} \qquad \text{Formula 7}$$

where $I_X$ is the leakage current of the board-mounted component under detection, $V_i$ is the fixed voltage, $R_X$ is an equivalent direct current impedance of the board-mounted component under detection, $V_O$ is the output voltage of the resistance testing module, $R_{ref}$ is a resistance of the reference resistor of the resistance testing module, and $I_{ref}$ is a current flowing through the reference resistor.

To resolve the foregoing technical problem, another embodiment of the present invention provides a leakage detection apparatus, which is applied to leakage current detection for a board-mounted component on a PCBA board, and includes: a voltage providing module connected to a leakage current input end of a board-mounted component under detection, and configured to provide a fixed voltage for the board-mounted component under detection; a resistance testing module including an operational amplifier and a reference resistor that is connected between an inverting input end of the operational amplifier and a voltage output of the operational amplifier, and configured to provide the reference resistor, where the inverting input end is connected to the leakage current output end of the board-mounted component under detection; and a control module connected to the board-mounted component under detection, the resistance testing module, and the voltage providing module, and configured to calculate, based on Ohm's law and according to an output voltage of the resistance testing module and the reference resistor, a leakage current flowing through the board-mounted component under detection.

As regards the foregoing leakage current detection apparatus, in a possible implementation manner, when the board-mounted component under detection is a semiconductor component, the leakage current input end is a terminal of the semiconductor component in cut-off state, and the leakage current output end is a drain terminal of the semiconductor in cut-off state.

As regards the foregoing leakage current detection apparatus, in a possible implementation manner, when the board-mounted component under detection is a capacitor having a positive pole and a negative pole, the leakage current input end is the positive pole of the capacitor, and the leakage current output end is the negative pole of the capacitor.

As regards the foregoing leakage current detection apparatus, in a possible implementation manner, when the board-mounted component under detection is a capacitor without a positive pole or a negative pole, the leakage current input end is one end of the capacitor, and the leakage current output end is the other end of the capacitor.

As regards the foregoing leakage current detection apparatus, in a possible implementation manner, the control module includes: a detecting unit connected to the voltage providing module and the leakage current output end of the resistance testing module, and configured to detect the output voltage of the resistance testing module; a calculating unit connected to the detecting unit, and configured to calculate the leakage current according to Formula 7:

$$I_X = \frac{V_i}{R_X} = \frac{V_O}{R_{ref}} = I_{ref} \qquad \text{Formula 7}$$

where $I_X$ is the leakage current of the board-mounted component under detection, $V_i$ is the fixed voltage provided by the voltage providing module, $R_X$ is an equivalent direct current impedance of the board-mounted component under detection, $V_O$ is the output voltage of the resistance testing module, $R_{ref}$ is a resistance of the reference resistor of the resistance testing module, and $I_{ref}$ is a current flowing through the reference resistor.

As regards the foregoing leakage current detection apparatus, in a possible implementation manner, the control module further includes an isolating unit configured to make one or more other components that are connected to the leakage current input end of the board-mounted component under detection equivalent to a first resistor, make one or more other components that are connected to the leakage current output end of the board-mounted component under detection equivalent to a second resistor, and configure an isolation end between the first resistor and the second resistor, which is away from the board-mounted component under detection, to have a same potential as the leakage current output end of the board-mounted component under detection.

As regards the foregoing leakage current detection apparatus, in a possible implementation manner, the isolating unit is further configured to, when the board-mounted component under detection is a board-mounted semiconductor component, configure the board-mounted semiconductor component to be in cut-off state.

Beneficial Effects

According the leakage current detection method and apparatus provided in the embodiments of the present invention, a board-mounted component under detection is connected to a resistance testing module, and a specific voltage is applied. In this way, a leakage current of the board-mounted component on a PCBA board can be calculated according to a reference resistor of the resistance testing module and an output voltage. Batch detection can be implemented without a need of removing the board-mounted component from the board, and a detection ratio is high. In addition, as proven by experiments, detection accuracy and detection efficiency are high.

Exemplary embodiments are described in detail with reference to accompanying drawings to make other features and aspects of the present invention clearer.

BRIEF DESCRIPTION OF THE DRAWINGS

Accompanying drawings included in the specification and constituting a part of the specification and the specification illustrate exemplary embodiments, features, and aspects of the present invention, and are used for explaining principles of the present invention.

DETAILED DESCRIPTION

Various exemplary embodiments, features, and aspects of the present invention are described in detail hereinafter with reference to accompanying drawings. In the drawings, identical reference numerals denote elements that have an identical or similar function. Although various aspects of the embodiments are shown in the drawings, unless otherwise specified, the drawings are not necessarily drawn to scale.

The special term "exemplary" herein refers to "can be used as an example, an embodiment, or an illustration". Any embodiment described as "exemplary" herein is not necessarily to be interpreted as optimal or better than other embodiments.

In addition, to better describe the present invention, many details are given in the following specific implementation manners. A person skilled in the art shall understand that the present invention may still be implemented even without such details. In other instances, well-known methods, means, elements, and circuits are not specifically described, so as to highlight the subject of the present invention.

Embodiment 1

Figure 2:
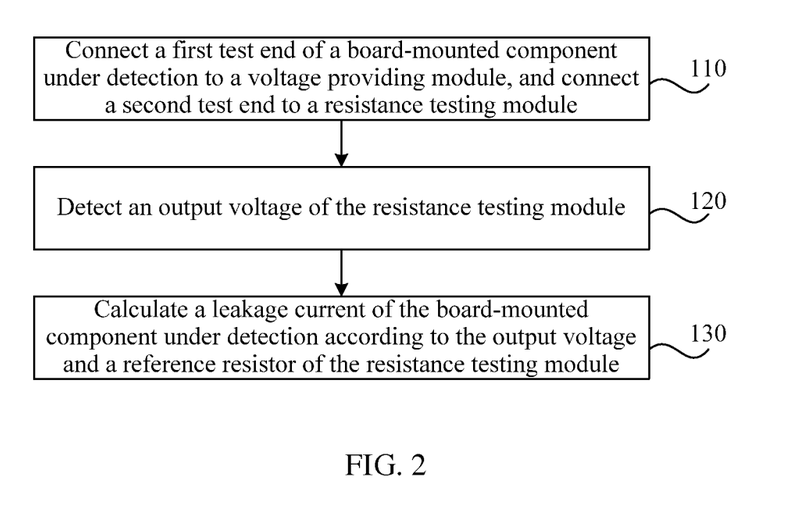
FIG. 2 shows a flowchart of a leakage current detection method according to an embodiment of the present invention.

FIG. 2 is a flowchart of a leakage current detection method according to an embodiment of the present invention. As shown in FIG. 2, the method is applied to leakage current detection for a board-mounted component on a PCBA board. The method includes the following steps:

Step 110. Connect a leakage current input end of a board-mounted component under detection to a voltage providing module, and connect a leakage current output end of the board-mounted component under detection to a resistance testing module.

To be specific, the board-mounted component under detection is an isolated board-mounted component, that is, a board-mounted component not connected to any other component. With respect to the isolated board-mounted component, in a PCB design stage of the board, a test point is separately arranged at the leakage current input end and the leakage current output end of the isolated board-mounted component. With respect to a component with a plurality of pins, two pins may be selected as the leakage current input end and the leakage current output end according to actual needs. For example, when the board-mounted component under detection is a semiconductor component, the leakage current input end is a source terminal of the semiconductor component in cut-off state, and the leakage current output end is a drain terminal of the semiconductor component in cut-off state; when the board-mounted component under detection is a capacitor having a positive pole and a negative pole, the leakage current input end is the positive pole of the capacitor, and the leakage current output end is the negative pole of the capacitor; and when the board-mounted component under detection is a capacitor without a positive pole or a negative pole, the leakage current input end is one end of the capacitor, and the leakage current output end is the other end of the capacitor.

In this step, the leakage current input end is connected to the voltage providing module, and the leakage current output end is connected to the resistance testing module.

Figure 3:
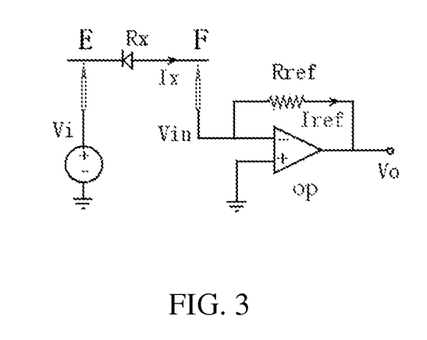
FIG. 3 shows a circuit diagram corresponding to the method shown in FIG. 2.

For example, as shown in FIG. 3, a board-mounted component Rx under detection is an isolated board-mounted component, in a printed circuit board (PCB) design stage of the board, a test point is separately arranged at a leakage current input end E end and a leakage current output end F end of the board-mounted component Rx under detection. The test point at the E end is connected to the voltage providing module to provide, for the board-mounted component Rx under detection, a fixed direct current voltage $V_i$ relative to a reference ground, and the resistance testing module is connected to the test point at the F end.

Step 120. Detect an output voltage of the resistance testing module.

In this embodiment, detection steps are performed in an in-circuit test (ICT) stage of manufacturing. As shown in FIG. 3, the resistance testing module includes: an operational amplifier OP, where an inverting input end of the operational amplifier OP is connected to the F end of the board-mounted component Rx under detection, a reference resistor Rref is connected between the inverting input end of the OP and the voltage output of the OP, and a non-inverting input end of the OP is connected to the reference ground. In this step, an output voltage $V_O$ relative to the reference ground is detected by a control module in an ICT device.

In another possible implementation manner, the resistance testing module may be a multimeter or an ohmmeter.

Step 130. Calculate, based on Ohm's law and according to the output voltage of the resistance testing module and the reference resistor of the resistance testing module, a leakage current flowing through the board-mounted component under detection.

Specifically, it may be learnt from FIG. 3 that the following Formula 1, Formula 2, and Formula 3 are valid:

$$V_O = -A * V_{in} \qquad \text{Formula 1}$$

$V_O$ is the output voltage of the resistance testing module relative to the reference ground, A is an open-loop gain of the operational amplifier OP, and $V_{in}$ is a voltage of the F end.

$$I_{ref} = \frac{V_{in} - V_O}{R_{ref}} \qquad \text{Formula 2}$$

$R_{ref}$ is a resistance of the reference resistor Rref of the resistance testing module, and $I_{ref}$ is a current flowing through the reference resistor Rref.

$$I_X = \frac{V_i - V_{in}}{R_X} \qquad \text{Formula 3}$$

$R_X$ is an equivalent direct current impedance of the board-mounted component Rx under detection.

According to a principle of a virtual open loop at the input end of the operational amplifier OP, Formula 4 is valid:

$$I_X \cong I_{ref} \qquad \text{Formula 4}$$

In combination with the foregoing Formulas 1 to 4, Formula 5 is obtained:

$$R_X = -\left(\frac{A}{A+1} * \frac{V_i}{V_O} + \frac{1}{A+1}\right) * R_{ref} \qquad \text{Formula 5}$$

Because the open loop gain A of the operational amplifier OP in the ICT device is far greater than 1, Formula 5 may be transformed into Formula 6:

$$R_X \cong \frac{V_i}{V_O} * R_{ref} \qquad \text{Formula 6}$$

In the foregoing formula, voltage $V_i$ is a known value, impedance $R_X$ can be measured by using the control module, and $V_{in} \cong 0$ is obtained by using Ohm's law and the principle of the virtual open loop at the input end of the operational amplifier OP. Therefore, Formula 7 may be deduced. In this step, leakage current $I_X$ is calculated according to Formula 7:

$$I_X = \frac{V_i}{R_X} = \frac{V_O}{R_{ref}} = I_{ref} \qquad \text{Formula 7}$$

It should be noted that, the board-mounted component in this embodiment mainly include a semiconductor, an oscillator, or a capacitor on the PCBA board, where the semiconductor may be a diode (including a light-emitting diode (LED)), a triode, a metal-oxide-semiconductor (MOS) transistor, or an integrated circuit (IC) component.

Embodiment 2

Figure 4:
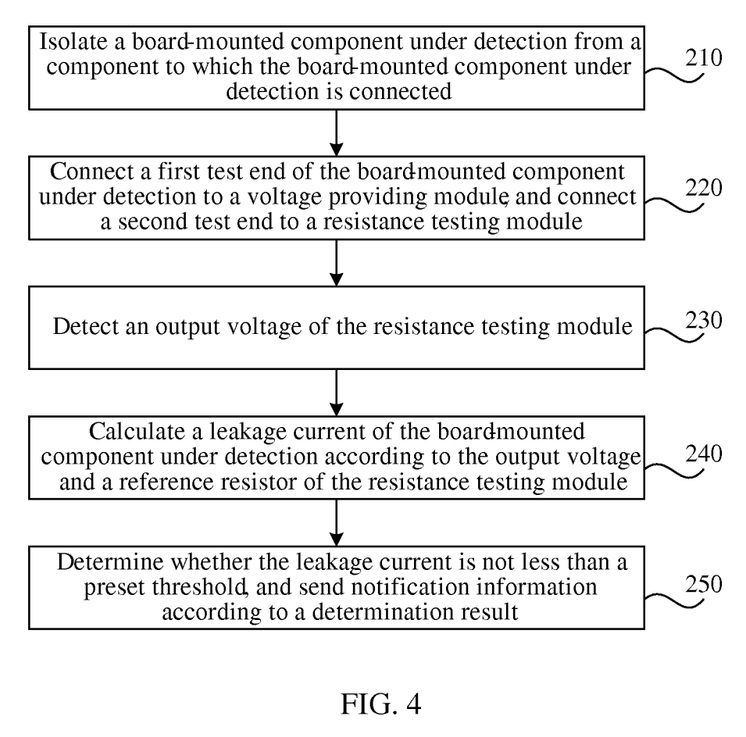
FIG. 4 shows a flowchart of a leakage current detection method according to another embodiment of the present invention.

FIG. 4 is a flowchart of a leakage current detection method according to another embodiment of the present invention. As shown in FIG. 4, a major difference between the embodiment shown in FIG. 4 and the embodiment shown in FIG. 2 lies in that the embodiment shown in FIG. 4 is used to detect a leakage current of a board-mounted component connected to one or more other components. The method mainly includes the following steps:

Step 210. Isolate a board-mounted component under detection from one or more other components to which the board-mounted component under detection is connected.

Figure 5:
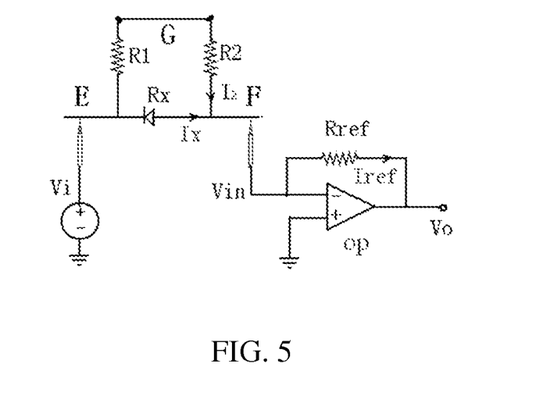
FIG. 5 shows a circuit diagram corresponding to the method shown in FIG. 4.

The isolation is intended to eliminate bypass impact of the one or more other components to which the board-mounted component under detection is connected on the board-mounted component under detection, and ensure that a current flowing through a second resistor R2 is 0, that is, $I_2=0$ (as shown in FIG. 5), and $I_X=I_{ref}$.

In this embodiment, the isolation is performed in the following manner.

As shown in FIG. 5, one or more other components connected to a leakage current input end of a board-mounted component Rx under detection are made equivalent to a first resistor R1, one or more other components connected to a leakage current output end of the board-mounted component Rx under detection are made equivalent to the second resistor R2, and an isolation end (a G end) of the first resistor R1 and the second resistor R2, that is, an end away from the board-mounted component Rx under detection, is set to have a same potential as an F end of the board-mounted component Rx under detection. Because an inverting input end and a non-inverting input end of an operational amplifier OP both have a same potential as a reference ground, the G end of the first resistor R1 and the second resistor R2 has a same potential as the reference ground.

In addition, with respect to a board-mounted semiconductor component, the board-mounted semiconductor component further needs to be configured to be in cut-off state.

Greater resistances of the first resistor R1 and the second resistor R2 indicate a higher test accuracy of a leakage current. Therefore, preferably the resistances of the first resistor R1 and the second resistor R2 are not less than 1 kiloohms (Kohms). When the resistances of the first resistor R1 and the second resistor R2 increase to be infinite, the board-mounted component under detection is equated with the isolated board-mounted component illustrated in Embodiment 1.

Steps 220 to 240 are the same as steps 110 to 130.

The isolation measure in step 210 eliminates bypass impact of the first resistor R1 and the second resistor R2. Therefore, with respect to a board-mounted component connected to one or more other components, a leakage current can be calculated by using the same method in Embodiment 1.

Preferably, this embodiment further includes:

Step 250. Determine whether the calculated leakage current is not less than a preset threshold, and send notification information according to a determination result.

The preset threshold may be an empirical value. If it is determined that the leakage current is not less than the preset threshold, it is considered that the leakage current exceeds a limit, and a warning notification or another sound notification is sent so that work personnel timely examine and repair the component whose leakage current exceeds the limit. If it is determined that the leakage current is less than the preset threshold, it is considered that the leakage current does not exceed the limit and the component is qualified. In this case, the system may send a notification indicating that the product is qualified, or may also be set not to make a notification.

Under special circumstances, with respect to a board-mounted component connected to one or more other components, where the resistances of the first resistor R1 and the second resistor R2 are relatively small, a leakage current cannot be detected effectively by using the method illustrated in Embodiment 2. In this case, a component the same as the component under detection may be surface mounted to a redundant location on a board, and then leakage current detection may be performed by using the method illustrated in Embodiment 1. In this case, although the component used on the board is not directly detected, in a case in which leakage currents of batch components from a vendor exceed the limit, this method can detect components that have a leakage current exception, may have a specific coverage, and plays a role in intercepting the batch components on a board whose leakage currents exceed the limit.

In addition, the leakage current detection method provided in the present application is not limited to being applied to an ICT stage, for example, it may further be applied to a functional test (FT) stage. However, an ICT device itself has a resistance testing module and can also detect an output voltage of a resistance testing module, and therefore, applying the method to the ICT stage is more convenient and efficient, without a need of additionally arranging apparatuses such as the resistance testing module and a control module.

Embodiment 3

Figure 6:
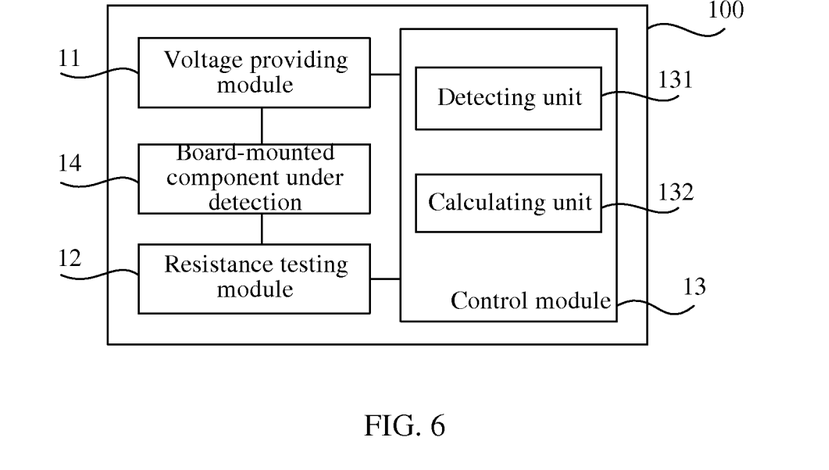
FIG. 6 shows a schematic structural diagram of a leakage current detection apparatus according to an embodiment of the present invention.

FIG. 6 is a schematic structural diagram of a leakage current detection apparatus according to an embodiment of the present invention. As shown in FIG. 6, the apparatus 100 includes a voltage providing module 11, a resistance testing module 12, and a control module 13.

The voltage providing module 11 is connected to a leakage current input end of a board-mounted component 14 under detection, and is configured to provide, for the board-mounted component 14 under detection, a fixed voltage relative to a reference ground; the resistance testing module 12 is connected to a leakage current output end of the board-mounted component 14 under detection, and is configured to provide a reference resistor; and the control module 13 is connected to the resistance testing module 12 and the voltage providing module 11, and is configured to calculate, according to an output voltage of the resistance testing module 12 and the reference resistor, a leakage current flowing through the board-mounted component 14 under detection.

In this embodiment, the board-mounted component 14 under detection is an isolated board-mounted component. To be specific, in this embodiment, the control module 13 includes a detecting unit 131 and a calculating unit 132.

The detecting unit 131 is connected to the voltage providing module 11 and the resistance testing module 12, and is configured to detect the output voltage of the resistance testing module 12 relative to the reference ground; and the calculating unit 132 is connected to the detecting unit 131, and is configured to calculate the leakage current of the board-mounted component 14 under detection according to Formula 7:

$$I_X = \frac{V_i}{R_X} = \frac{V_O}{R_{ref}} = I_{ref} \qquad \text{Formula 7}$$

where $I_X$ is the leakage current of the board-mounted component 14 under detection, $V_i$ is the fixed voltage relative to the reference ground provided by the voltage providing module 11, $R_X$ is an equivalent direct current impedance of the board-mounted component 14 under detection, $V_O$ is the output voltage of the resistance testing module 12 relative to the reference ground, $R_{ref}$ is a resistance of the reference resistor of the resistance testing module 12, and $I_{ref}$ is a current flowing through the reference resistor.

In addition, in this embodiment, a structure of the resistance testing module 12 may be the structure shown in FIG. 3 and FIG. 5, and may also be a multimeter or an ohmmeter. Any specific structure may be equivalent to the structure shown in FIG. 3 and FIG. 5.

Embodiment 4

Figure 7:
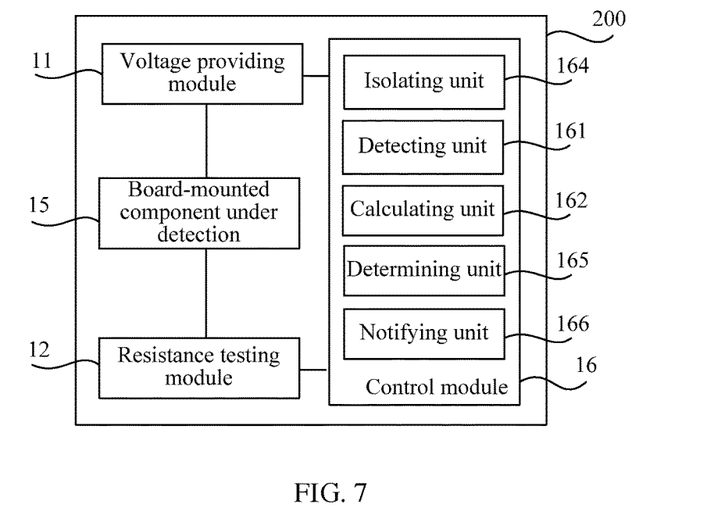
FIG. 7 shows a schematic structural diagram of a leakage current detection apparatus according to another embodiment of the present invention.

FIG. 7 is a schematic structural diagram of a leakage current detection apparatus according to an embodiment of the present invention. Components in FIG. 7 that have same reference numerals as those in FIG. 6 have same functions. For brevity, detailed description of these components are omitted.

As shown in FIG. 7, a major difference between a detection apparatus 200 shown in FIG. 7 and the detection apparatus 100 shown in FIG. 6 lies in that: a board-mounted component 15 under detection in this embodiment is a board-mounted component connected to one or more other components; to eliminate bypass impact of the one or more other components to which the board-mounted component 15 under detection is connected on the board-mounted component under detection, the board-mounted component 15 under detection needs to be isolated from the one or more other components to which the board-mounted component 15 under detection is connected. Accordingly, the control module 16 in this embodiment further includes an isolating unit 164. The isolating unit 164 is configured to isolate the board-mounted component 15 under detection from the one or more other components to which the board-mounted component 15 under detection is connected. Specifically, the isolating unit 164 makes one or more other components that are connected to a leakage current input end of the board-mounted component 15 under detection equivalent to a first resistor, and makes one or more other components that are connected to a leakage current output end of the board-mounted component 15 under detection equivalent to a second resistor, and configures an isolation end between the first resistor and the second resistor, which is away from the board-mounted component 15 under detection, to have a same potential as the leakage current output end of the board-mounted component 15 under detection.

Further, to enable a work personnel to timely learn a situation of an abnormal leakage current, the controller 16 in this embodiment further includes a determining unit 165 and a notifying unit 166. The determining unit 165 is configured to determine whether a calculated leakage current is not less than a preset threshold, and the notifying unit 166 is configured to send a notification according to a determination result of the determining unit 165, for example, report an alarm if the leakage current is not less than the preset threshold.

The control module 16 in this embodiment further includes a detecting unit 161 and a calculating unit 162 that are the same as the detecting unit 131 and the calculating unit 132 of the control module 13 in Embodiment 3.

Figure 8:
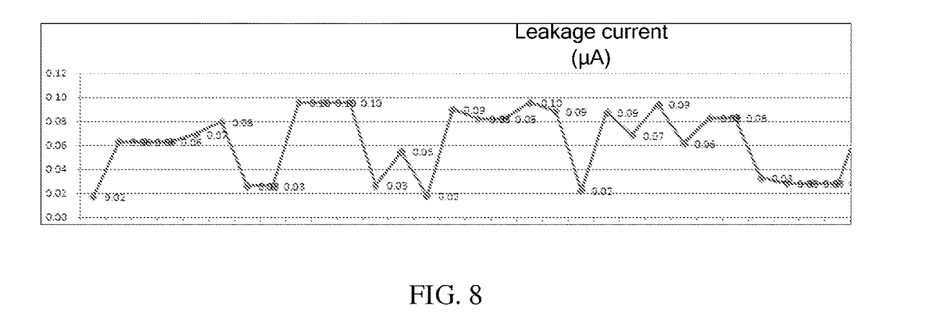
FIG. 8 shows an accuracy effect diagram of a test that uses the leakage current detection method and apparatus according to the present invention.

FIG. 8 is a schematic diagram of a test effect of leakage current detection performed by using the leakage current detection method and apparatus according to the embodiments of the present invention. The transverse axis indicates time spent in testing a leakage current, and the longitudinal axis indicates a value of the leakage current. It may be seen from FIG. 8 that accuracy of a leakage current test performed by using the method and apparatus reaches 0.02 microamperes (μA). As regards test efficiency, the present invention can achieve a microsecond level, which is higher than the minute-level test efficiency in the prior art by a plurality of magnitude levels. In addition, the test can be stable and is substantially not affected by a component fluctuation.

According to the leakage current detection method and apparatus provided in the embodiments of the present invention, test points are arranged on the board-mounted component in a PCB design stage of the board, and in an ICT stage, a specified voltage and a reference resistor are provided on the board-mounted component to perform the leakage current test. In this way, 100% full detection can be implemented for the board-mounted component, a detection ratio is high, test accuracy is high, and a specific detection ratio may be flexibly adjusted according to an input-output ratio.

A person of ordinary skill in the art may be aware that exemplary units and algorithm steps in the embodiments described in the specification may be implemented by electronic hardware or a combination of computer software and electronic hardware. Implementing the functions in a form of hardware or software depends on specific applications and design restriction conditions of the technical solutions. Those skilled in the art may select different methods according to the specific applications to implement the described functions. However, such implementation shall not be construed as going beyond the scope of the present invention.

If the functions are implemented in the form of computer software and are for sale or use as separate products, to some extent, it may be considered that all or a part (for example, the part contributing to the prior art) of the technical solutions of the present invention are embodied in the form of a computer software product. The computer software product is generally stored in a computer-readable storage medium, and includes several instructions for instructing a computer device (which may be a personal computer, a server, a network device, or the like) to perform all or a part of the steps of the methods described in the embodiments of the present invention. The foregoing storage medium includes any medium that can store program code, such as a universal serial bus (USB) flash drive, a removable hard disk, a read-only memory (ROM), a random access memory (RAM), a magnetic disk, or an optical disc.

The foregoing descriptions are merely specific embodiments of the present invention, but are not intended to limit the protection scope of the present invention. Any variation or replacement readily figured out by a person skilled in the art within the technical scope disclosed in the present invention should fall within the protection scope of the present invention. Therefore, the protection scope of the present invention is subjected to the appended claims.

What is claimed is:

1. A leakage current detection method applied to leakage current detection for a board-mounted component on a printed circuit board assembly (PCBA) board, the method comprising:
   electrically isolating the board-mounted component under detection from other components that are electrically-connected to the board-mounted component under detection, wherein electrically isolating the board-mounted component comprises:
      making one or more other components that are connected to a leakage current input end of the board-mounted component under detection equivalent to a first resistor;
      making one or more other components that are connected to a leakage current output end of the board-mounted component under detection equivalent to a second resistor; and
      configuring an isolation end between the first resistor and the second resistor to have a same potential as the leakage current output end of the board-mounted component under detection;
   providing a fixed voltage for the leakage current input end of a board-mounted component under detection, and connecting the leakage current output end of the board-mounted component under detection to an inverting input end of an operational amplifier of a resistance testing module, wherein the resistance testing module comprises the operational amplifier and a reference resistor that is connected between the inverting input end of the operational amplifier and the voltage output of the operational amplifier;
   detecting an output voltage of the resistance testing module; and
   calculating, based on Ohm's law and according to the output voltage and the reference resistor, a leakage current flowing through the board-mounted component under detection.

2. The leakage current detection method according to claim 1, wherein the board-mounted component under detection is a semiconductor component, wherein the leakage current input end is a source terminal of the semiconductor component in cut-off state, and wherein the leakage current output end is drain terminal of the semiconductor in cut-off state.

3. The leakage current detection method according to claim 1, wherein the board-mounted component under detection is a capacitor having a positive pole and a negative pole, wherein the leakage current input end is the positive pole of the capacitor, and wherein the leakage current output end is the negative pole of the capacitor.

4. The leakage current detection method according to claim 1, wherein the board-mounted component under detection is a capacitor without a positive pole or a negative pole, wherein the leakage current input end is one end of the capacitor, and wherein the leakage current output end is the other end of the capacitor.

5. The leakage current detection method according to claim wherein isolating the board-mounted component under detection from the one or more other components to which the board-mounted component under detection is connected further comprises configuring the hoard-mounted semiconductor component to be in cut-off state when the board-mounted component under detection is a board-mounted semiconductor component.

6. The leakage current detection method according to claim 1, wherein calculating, based on Ohm's law and according to the output voltage and the reference resistor, the leakage current flowing through the board-mounted component under detection comprises calculating the leakage current flowing through the board-mounted component under detection according to an equation:

$$I_X = \frac{V_i}{R_X} = \frac{V_O}{R_{ref}} = I_{ref},$$

wherein $I_X$ is the leakage current of the board-mounted component under detection, $V_i$ is the fixed voltage, $R_X$ is an equivalent direct current impedance of the board-mounted component under detection, $V_O$ is the output voltage of the resistance testing module, $R_{ref}$ is a resistance of the reference resistor of the resistance testing module, and $I_{ref}$ is a current flowing through the reference resistor.

7. A leakage current detection apparatus applied to leakage current detection for a board-mounted component on a printed circuit board assembly (PCBA) board, the apparatus comprising:
isolation circuitry configured to electrically isolate the board-mounted component under detection from other components that are electrically-connected to the board-mounted component under detection, wherein the isolation circuitry is configured to:
make one or more other components that are connected to a leakage current input end of the hoard-mounted component under detection equivalent to a first resistor;
make one or more other components that are connected to a leakage current output end of the board-mounted component under detection equivalent to a second resistor; and
form an isolation end between the first resistor and the second resistor, wherein the isolation end has a same potential as the leakage current output end of the hoard-mounted component under detection;
a voltage source connected to the leakage current input end of a hoard-mounted component under detection, and configured to provide a fixed voltage for the hoard-mounted component under detection;
resistance testing circuitry comprising an operational amplifier and a reference resistor that is connected between an inverting input end of the operational amplifier and the voltage output end of the operational amplifier, and configured to provide the reference resistor, wherein the inverting input end of the board-mounted component under detection is connected to the leakage current output end of the board-mounted component under detection; and
control circuitry connected to the board-mounted component under detection, the resistance testing circuitry, and the voltage source, and configured to calculate, based on Ohm's law and according to an output voltage of the resistance testing module and the reference resistor, a leakage current flowing through the board-mounted component under detection.

8. The leakage current detection apparatus according to claim 7, wherein the hoard-mounted component under detection is a semiconductor component, wherein the leakage current input end is a source terminal of the semiconductor component in cut-off state, and wherein the leakage current output end is drain terminal of the semiconductor in cut-off state.

9. The leakage current detection apparatus according to claim 7, wherein the board-mounted component under detection is a capacitor having a positive pole and a negative pole, wherein the leakage current input end is the positive pole of the capacitor, and wherein the leakage current output end is the negative pole of the capacitor.

10. The leakage current detection apparatus according to claim 7, wherein the board-mounted component under detection is a capacitor without a positive pole or a negative pole, wherein the leakage current input end is one end of the capacitor, and wherein the leakage current output end is the other end of the capacitor.

11. The leakage current detection apparatus according to claim 7, wherein the control module comprises:
detecting circuitry connected to the voltage providing module and the leakage current output end of the resistance testing module, and configured to detect the output voltage of the resistance testing module;
a processor connected to the detecting circuitry, and configured to calculate the leakage current according to an equation:

$$I_X = \frac{V_i}{R_X} = \frac{V_O}{R_{ref}} = I_{ref},$$

wherein $I_X$ is the leakage current of the board-mounted component under detection, $V_i$ is the fixed voltage provided by the voltage providing module, $R_X$ is an equivalent direct current impedance of the board-mounted component under detection, $V_O$ is the output voltage of the resistance testing module, $R_{ref}$ is a resistance of the reference resistor of the resistance testing module, and $I_{ref}$ is a current flowing through the reference resistor.

12. A leakage current detection apparatus for leakage current detection of a board-mounted component on a printed circuit board assembly, the apparatus comprising:
a voltage source connected to a leakage current input end of a hoard-mounted component under detection, and configured to provide a fixed voltage for the board-mounted component under detection;
resistance testing circuitry comprising an operational amplifier and a reference resistor that is connected between an inverting input end of the operational amplifier and the voltage output end of the operational amplifier, and configured to provide the reference resistor, wherein the inverting input end is connected to the leakage current output end of the hoard-mounted component under detection;
control circuitry connected to the board-mounted component under detection, the resistance testing circuitry, and the voltage source, and configured to calculate, based on Ohm's law and according to an output voltage of the resistance testing module and the reference resistor, a leakage current flowing through the board-mounted component under detection; and
isolation circuitry configured to:
make one or more other components that are connected to the leakage current input end of the board-mounted component under detection equivalent to a first resistor;
make one or more other components that are connected to the leakage current output end of the board-mounted component under detection equivalent to a second resistor; and configure an isolation end between the first resistor and the second resistor, which is away from the board-mounted component under detection, to have a same potential as the leakage current output end of the board-mounted component under detection.

13. The leakage current detection apparatus according to claim 12, wherein the isolation circuitry is further configured to configure the board-mounted semiconductor component to be in cut-off state when the board-mounted component under detection is a board-mounted semiconductor component.

14. The leakage current detection apparatus according to claim 12, wherein the isolation circuitry is further configured to electrically isolate the board-mounted component under detection from other components that are electrically-connected to the board-mounted component under detection.

* * * * *

UNITED STATES PATENT AND TRADEMARK OFFICE
CERTIFICATE OF CORRECTION

PATENT NO. : 9,625,517 B2
APPLICATION NO. : 14/497660
DATED : April 18, 2017
INVENTOR(S) : Qingsong Zhu et al.

It is certified that error appears in the above-identified patent and that said Letters Patent is hereby corrected as shown below:

In the Claims

Column 12, Line 59, Claim 5 should read:
The leakage current detection method according to claim 1, wherein isolating the board-mounted component under detection from the one or more other components to which the board-mounted component under detection is connected further comprises configuring the board-mounted semiconductor component to be in cut-off state when the board-mounted component under detection is a board-mounted semiconductor component.

Column 13, Lines 30, 40, 42, and 44, Claim 7 should read:
A leakage current detection apparatus applied to leakage current detection for a board-mounted component on a printed circuit board assembly (PCBA) board, the apparatus comprising:
isolation circuitry configured to electrically isolate the board-mounted component under detection from other components that are electrically-connected to the board-mounted component under detection, wherein the isolation circuitry is configured to:
make one or more other components that are connected to a leakage current input end of the board-mounted component under detection equivalent to a first resistor;
make one or more other components that are connected to a leakage current output end of the board-mounted component under detection equivalent to a second resistor; and
form an isolation end between the first resistor and the second resistor, wherein the isolation end has a same potential as the leakage current output end of the board-mounted component under detection;
a voltage source connected to the leakage current input end of a board-mounted component under detection, and configured to provide a fixed voltage for the board-mounted component under detection;
resistance testing circuitry comprising an operational amplifier and a reference resistor that is connected between an inverting input end of the operational amplifier and the voltage output end of the operational amplifier, and configured to provide the reference resistor, wherein the inverting input end of the board-mounted component under detection is connected to the leakage current output end of the board-mounted component under detection; and Signed and Sealed this
Eleventh Day of July, 2017

Joseph Matal
*Performing the Functions and Duties of the
Under Secretary of Commerce for Intellectual Property and
Director of the United States Patent and Trademark Office* control circuitry connected to the board-mounted component under detection, the resistance testing circuitry, and the voltage source, and configured to calculate, based on Ohm's law and according to an output voltage of the resistance testing module and the reference resistor, a leakage current flowing through the board-mounted component under detection.